(12) United States Patent
Ecker (10) Patent No.: US 11,099,224 B2
(45) Date of Patent: Aug. 24, 2021

(54) METHOD AND CIRCUITRY FOR SEMICONDUCTOR DEVICE PERFORMANCE CHARACTERIZATION

(71) Applicant: Marvell Israel (M.I.S.L) Ltd., Yokne'am (IL)

(72) Inventor: Reuven Ecker, Haifa (IL)

(73) Assignee: Marvell Israel (M.I.S.L) Ltd., Yokne'am (IL)

( * ) Notice: Subject to any disclaimer, the term of this patent is extended or adjusted under 35 U.S.C. 154(b) by 0 days.

(21) Appl. No.: 15/929,800

(22) Filed: May 22, 2020

(65) Prior Publication Data

US 2020/0371151 A1 Nov. 26, 2020

Related U.S. Application Data

(60) Provisional application No. 62/852,580, filed on May 24, 2019.

(51) Int. Cl.
*G01R 31/26* (2020.01)
*G01R 31/28* (2006.01)
*H03K 3/03* (2006.01)

(52) U.S. Cl.
CPC ..... *G01R 31/2608* (2013.01); *G01R 31/2884* (2013.01); *H03K 3/0322* (2013.01)

(58) Field of Classification Search
CPC ............ G01R 31/2608; G01R 31/2884; G01R 31/2882; G01R 31/2621; G01R 31/2607; G01R 31/2601; G01R 31/275; H03K 3/0322

USPC .................................. 324/750.3, 537, 500
See application file for complete search history.

(56) References Cited

U.S. PATENT DOCUMENTS

| 8,354,857 | B1 | 1/2013 | Rosen | |
|---|---|---|---|---|
| 2005/0246597 | A1* | 11/2005 | Whetsei | G06F 11/221 714/712 |
| 2007/0205802 | A1* | 9/2007 | Perisetty | H03K 19/00315 326/27 |
| 2020/0135511 | A1* | 4/2020 | Lee | G06T 7/0008 |

* cited by examiner

*Primary Examiner* — Giovanni Astacio-Oquendo (57) ABSTRACT

Performance measuring circuitry, for determining relative operational performance attributes of different types of a class of semiconductor component disposed on a semiconductor die, includes a first oscillator circuit including a plurality of first circuit element modules having a first circuit topology. The first oscillator circuit provides a first performance indication indicative of a collective performance attribute of all types of components in the class. A second oscillator circuit separate from the first oscillator circuit includes a plurality of second circuit element modules having a second circuit topology, and provides a second performance indication responsive to different contributions from different types of components in the class. A comparison circuit receives outputs of the first and second oscillator circuits and determines the relative performance characteristic of the different types of components. Dice may be binned according to performance, for use in assembly of operational circuits with different performance characteristics.

20 Claims, 7 Drawing Sheets

METHOD AND CIRCUITRY FOR SEMICONDUCTOR DEVICE PERFORMANCE CHARACTERIZATION

CROSS REFERENCE TO RELATED APPLICATION

This disclosure claims the benefit of commonly-assigned U.S. Provisional Patent Application No. 62/852,580, filed May 24, 2019, which is hereby incorporated by reference herein in its entirety.

FIELD OF USE

This disclosure relates to the characterization of semiconductor device speeds in integrated circuits. More particularly, this disclosure relates to a method and circuitry for determining the relative speeds of different types of a class of semiconductor components, such as p-type and n-type transistors, on the same integrated circuit die.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Integrated circuits frequently include more than one type of a particular class of semiconductor component on the same integrated circuit die (or "chip"). For example, where the class of semiconductor component is transistors, a single integrated circuit die may include both p-type transistors and n-type transistors, which, in a CMOS die, would be PMOS transistors and NMOS transistors. Because of process variations during semiconductor die fabrication, the performance of the different types of devices on a single integrated circuit die may differ. Thus, for example, the speed of p-type transistors on the integrated circuit die may differ from the speed of n-type transistors on the integrated circuit die, and both the speeds, and the relative speed, of the two types of transistors may change differently under different process conditions during fabrication or different temperature conditions during use, which will impact the relative speeds of various circuits on the die in which the different types of transistors are disposed.

SUMMARY

Electronic apparatus in accordance with implementations of the subject matter of this disclosure includes operational circuitry disposed on a semiconductor die, and performance measuring circuitry on the semiconductor die for determining relative operational performance attributes of different types of a class of semiconductor component disposed on the semiconductor die. The performance measuring circuitry includes a first oscillator circuit comprising a plurality of first circuit element modules having a first circuit topology, the first oscillator circuit being configured to provide a first performance indication indicative of a collective performance attribute of all types of components in the class of semiconductor components on the semiconductor die, a second oscillator circuit separate from the first oscillator circuit, the second oscillator circuit comprising a plurality of second circuit element modules having a second circuit topology different from the first circuit topology of the first circuit element modules, the second oscillator circuit being configured to provide a second performance indication responsive to different contributions from different types of components in the class of semiconductor components on the semiconductor die, and a comparison circuit configured to receive an output of the first oscillator circuit and an output of the second oscillator circuit, and to determine a relative performance characteristic of the different types of components in the class of semiconductor components on the semiconductor die.

In a first implementation of such electronic apparatus, the class of semiconductor component may be transistors. In such an implementation, a first type of semiconductor component in the class of semiconductor components may be an n-type transistor and a second type of semiconductor component in the class of semiconductor components may be a p-type transistor.

In a second implementation of such electronic apparatus, the first oscillator circuit may be a first ring oscillator, and each circuit element module in the plurality of first circuit element modules having the first circuit topology may be an inverter, and the second oscillator circuit may be a second ring oscillator, and each circuit element module in the plurality of second circuit element modules having the second circuit topology may be a cross-coupled differential cell including a plurality of components from each of the types of semiconductor components in the class of semiconductor components.

In a first variant of that second implementation, the first ring oscillator may have a frequency response that is insensitive to differences in performance between a first type of semiconductor component and a second type of semiconductor component, and the second ring oscillator may have a frequency response that differs depending on relative performance of the first type of semiconductor component and the second type of semiconductor component on the semiconductor die.

In a form of that first variant, output of the first ring oscillator may have a first frequency, output of the second ring oscillator may have a second frequency, and the comparison circuitry may be configured to indicate, based on relative values of the first frequency and the second frequency, that (a) the first type of semiconductor component and the second type of semiconductor component have speeds with a target relationship, (b) the relationship of the speed of the first type of semiconductor component to the speed of the second type of semiconductor component exceeds the target relationship, or (c) the relationship of the speed of the second type of semiconductor component to the speed of the first type of semiconductor component exceeds the target relationship.

In that form of the first variant, the comparison circuitry may further be configured to, when the speed of the first type of semiconductor component and the speed of the second type of semiconductor component meet the target relationship, indicate that the speed of the first type of semiconductor component and the speed of the second type of semiconductor component are (a) target speed values, (b) faster than target speed values, or (c) slower than target speed values.

In another variant of the second implementation, the cross-coupled differential cell may include a first n-type transistor in series with a first p-type transistor, there being a first junction between the first n-type transistor and the first p-type transistor, and a second n-type transistor in series with a second p-type transistor, there being a second junction between the second n-type transistor and the second p-type transistor. The series combination of the first n-type transistor and the first p-type transistor may be coupled in parallel with the series combination of the second n-type transistor and the second p-type transistor, a gate of the first p-type transistor may be cross-coupled to the second junction, and a gate of the second p-type transistor may be cross-coupled to the first junction.

In that variant of the second implementation, in the ring of cross-coupled differential cells, an uninverted output of each cell may be coupled to an uninverted input of a subsequent cell, and an inverted output of each cell may be coupled to an inverted input of the subsequent cell.

A method according to implementations of the subject matter of this disclosure, for determining relative operational performance attributes of different types of a class of semiconductor component that are included in an integrated circuit disposed on a semiconductor die, includes measuring a first performance indication indicative of a collective performance attribute of all types of components in the class of semiconductor components on the semiconductor die using a first oscillator circuit including a plurality of first circuit element modules having a first circuit topology, measuring a second performance indication responsive to different contributions from different types of components in the class of semiconductor components on the semiconductor die using a second oscillator circuit separate from the first oscillator circuit, the second oscillator circuit including a plurality of second circuit element modules having a second circuit topology different from the first circuit topology of the first circuit element modules, and comparing the first performance indication and the second performance indication to determine a relative performance characteristic of the different types of components in the class of semiconductor components on the semiconductor die.

In a first implementation of such a method, measuring a first performance indication indicative of a collective performance attribute of all types of components in the class of semiconductor components includes measuring performance of a first type of transistor and performance of a second type of transistor. In such an implementation, measuring performance of a first type of transistor and performance of a second type of transistor may include measuring performance of an n-type transistor and performance of a p-type transistor.

In a second implementation of such a method, the measuring a first performance indication indicative of a collective performance attribute of all types of components in the class of semiconductor components may include measuring a first performance indication indicative of a collective performance attribute of all types of components in the class of semiconductor components using a first ring oscillator in which each circuit element module in the plurality of first circuit element modules having the first circuit topology is an inverter, and the measuring a second performance indication including different contributions from different types of components in the class of semiconductor components on the semiconductor die may include measuring a second performance indication including different contributions from different types of components in the class of semiconductor components on the semiconductor die using a second ring oscillator in which each circuit element module in the plurality of second circuit element modules having the second circuit topology is a cross-coupled differential cell including a plurality of components from each of the types of semiconductor components in the class of semiconductor components.

In that second implementation, the measuring a first performance indication indicative of a collective performance attribute of all types of components in the class of semiconductor components using the first ring oscillator may include measuring a first performance indication indicative of a collective performance attribute of all types of components in the class of semiconductor components using the first ring oscillator that has a frequency response that is insensitive to differences in performance between different types of components in the class of semiconductor components, and the measuring a second performance indication responsive to different contributions from different types of components in the class of semiconductor components on the semiconductor die using a second ring oscillator may include measuring a second performance indication responsive to different contributions from different types of components in the class of semiconductor components on the semiconductor die using a second ring oscillator using the ring oscillator that has a frequency response that differs depending on relative performance of the different types of components in the class of semiconductor components.

In a first variant of that second implementation, when output of the first ring oscillator has a first frequency, and output of the second ring oscillator has a second frequency, the comparing the first performance indication and the second performance indication may include indicating, based on relative values of the first frequency and the second frequency, that (a) the first type of component in the class of semiconductor components and the second type of component in the class of semiconductor components have speeds with a target relationship, (b) the relationship of the speed of the first type of component in the class of semiconductor components to the speed of the second type of component in the class of semiconductor components exceeds the target relationship, or (c) the relationship of the speed of the second type of component in the class of semiconductor components to the speed of the first type of component in the class of semiconductor components exceeds the target relationship.

In a first form of that first variant, the comparing the first performance indication and the second performance indication may further include, when the speed of the first type of semiconductor component and the speed of the second type of semiconductor component meet the target relationship, indicating that the speed of the first type of semiconductor component and the speed of the second type of semiconductor component are (a) target speed values, (b) faster than target speed values, or (c) slower than target speed values.

That first form of the first variant of the second implementation may further include calibrating the comparing.

In a version of that first form of the first variant of the second implementation, the calibrating may include measuring performance of a first one of the first type of component in the class of semiconductor components having a known first performance and measuring performance of a second one of the second type of component in the class of semiconductor components having a known second performance where the known first performance and the known second performance meet a first predetermined relationship and storing a first result indicative of a first performance metric of a combination of the first type of component in the class of semiconductor components and the second type of component in the class of semiconductor components, measuring performance of a second one of the first type of component in the class of semiconductor components having a known third performance and measuring performance of a second one of the second type of component in the class of semiconductor components having a known fourth performance that is known to exceed a second predetermined relationship to the known third performance and storing a second result indicative of a second performance metric of the combination of the first type of component in the class of semiconductor components and the second type of component in the class of semiconductor components, and measuring performance of a third one of the first type of component in the class of semiconductor components having a known fifth performance and measuring performance of a third one of the second type of component in the class of semiconductor components having a known sixth performance where the known fifth performance is known to exceed a third predetermined relationship to the known sixth performance and storing a third result indicative of a third performance metric of the combination of the first type of component in the class of semiconductor components and the second type of component in the class of semiconductor components.

In that version, the storing a first result indicative of a first performance metric of a combination of the first type of component in the class of semiconductor components and the second type of component in the class of semiconductor components may include storing a performance metric indicating that the speed of the first type of component in the class of semiconductor components and the speed of the second type of component in the class of semiconductor components are (a) target speed values, (b) faster than target speed values, or (c) slower than target speed values.

In that version, the indicating, based on relative values of the first frequency and the second frequency, may include comparing the relative values of the first frequency and the second frequency to the first performance metric, the second performance metric and the third performance metric.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

As described above, integrated circuits frequently include more than one type of a particular class of semiconductor component on the same integrated circuit die. For example, where the class of semiconductor component is transistors, a single integrated circuit die may include both p-type transistors and n-type transistors, which, in a CMOS die, would be PMOS transistors and NMOS transistors. Because of process variations during semiconductor die fabrication, the performance of the different types of devices on a single integrated circuit die may differ. Thus, for example, the speed of p-type transistors on the integrated circuit die may differ from the speed of n-type transistors on the same integrated circuit die. The difference in speeds, and the relative speed, of the two types of transistors may change differently under different process conditions during fabrication or different temperature conditions during use.

The relative performance, as measured by, e.g., speed, of n-type and p-type transistors may affect the operation and performance of any circuitry that is formed on the integrated circuit die from such transistors. Thus, for example, the speed or other operational characteristics of an electronic device such as a network switch, an Internet physical layer transceiver (PHY), or a processor, may be impacted by the relative performance of the different types of transistors or other classes of semiconductor components on each particular semiconductor die. Therefore, each particular semiconductor die typically is tested to characterize the relative performance of the different types of a class of semiconductor component. In some cases, it may be possible to test random semiconductor dice or wafers in a batch of semiconductor dice or wafers, and from the random dice or wafers generalize to other dice or wafers in the batch.

The remainder of this description will focus on transistors as the class of semiconductor component, types of which whose performance may be characterized in accordance with implementations of the subject matter of this disclosure. However, the principles behind the subject matter of this disclosure may be adapted to characterize the relative performance of different types of other classes of semiconductor components.

The performance of semiconductor components such as transistors is affected by process conditions during fabrication of the semiconductor die, which may differ among different batches of wafers or dice, as well as by operating temperature which may differ from time to time even for the same die. To characterize the performance of components such as transistors, testing circuitry, separate from the functional circuitry on the semiconductor die, may be formed on the semiconductor die. Based on the assumption, which is generally correct, that process conditions during fabrication, as well as operating temperature, are more or less uniform across a single die, measuring the performance of the testing circuitry can provide an indication of the performance of components elsewhere on the die. However, in some cases, particularly for larger dice, where it is more likely for there to be process or temperature variations across a single die, it may be advantageous to include multiple copies of the testing circuitry distributed across the die.

One type of testing circuitry that is typically provided on an integrated circuit die is a ring oscillator (sometimes referred to as "debug ring oscillator" or "DRO"). A DRO, an example of which is described in U.S. Pat. No. 8,354,857, which is hereby incorporated by reference herein in its entirety, may be a standard ring oscillator formed as a ring of an odd number of standard inverter elements, which oscillates at a particular frequency. However, while the frequency output of a standard DRO may provide an indication of the average performance of all types of transistors (or all types of some other class of components), the alternating inverters will cancel out differences between, e.g., n-type transistors and p-type transistors. Therefore, it is not possible with a typical DRO to determine relative performance of p-type transistors as compared to n-type transistors.

Therefore, in accordance with implementations of the subject matter of this disclosure, a second variety of oscillator, along with a DRO, is provided on the semiconductor die of an electronic device. This second type of oscillator is formed as ring of an even number of repeating cells, plus control elements, as described in more detail below.

Each cell includes cross-coupled instances of the two different types of components. Specifically, in an implementation of the transistor case, each cell includes four transistors. A first p-type transistor is coupled in series with a first n-type transistor, and a second p-type transistor is coupled in series with a second n-type transistor, and those two series-coupled pairs are coupled in parallel. The respective junction between the p-type transistor and the n-type transistor in each series-coupled pair is cross-coupled to the gate of the p-type transistor in the other series-coupled pair.

The gate of the n-type transistor in the first series-coupled pair serves as the uninverted input of the cell, while the gate of the n-type transistor in the second series-coupled pair serves as the inverted input of the cell. The junction between the p-type transistor and the n-type transistor in the second series-coupled pair serves as the uninverted output of the cell, while the junction between the p-type transistor and the n-type transistor in the first series-coupled pair serves as the inverted output of the cell. The inverted output of each cell is coupled to the inverted input of the next cell, while the uninverted output of each cell is coupled to the uninverted input of the next cell.

At a "beginning/end" position of the ring, the uninverted output of the "last" cell is fed back to a NAND gate used as an ENABLE switch, the output of which is coupled to the uninverted input of the "first" cell and, via an inverter, to the inverted input of the first cell. A second input of the NAND gate is used as an ENABLE signal to turn on testing when required or desired.

In the operation of an implementation of a cross-coupled cell as described, as the uninverted input rises and the inverted input falls, the n-type transistor of the second series-coupled pair conducts less until it stops conducting and the n-type transistor of the first series-coupled pair starts conducting. For the outputs to change states, with the uninverted output rising and the inverted output falling, the p-type transistor of the first series-coupled pair should conduct less until it stops conducting and the p-type transistor of the second series-coupled pair should start conducting. Because of the cross-coupled structure, and because CMOS devices are not strictly 'ON' or 'OFF' but conduct more or less strongly as the gate voltage changes, the cell outputs change states only when the n-type transistor of the first series-coupled pair starts conducting strongly enough to overcome the current of the p-type transistor of the first series-coupled pair, which pulls the inverted output down enough to start conduction in the p-type transistor of the second series-coupled pair, which in turn starts to pull the uninverted output higher to further weaken conduction in the p-type transistor of the first series-coupled pair.

The process operates in the opposite manner when the states are changing in the other direction.

Thus the cell has a hysteresis-like delay in either direction before it changes state, and that delay is a function of the relative strengths of the n-type transistor of the first series-coupled pair and the p-type transistor of the first series-coupled pair, which, in a CMOS device, are, respectively, NMOS and PMOS components. The delay is therefore an indication of the relative strength.

The output of the ring oscillator of cross-coupled transistor cells is a signal having a frequency value, and that single value is not sufficient to indicate the relative speeds of the n-type component and the p-type component. However, in accordance with implementations of the subject matter of this disclosure, a standard DRO also is present on the semiconductor die of the electronic device, and comparison of the outputs of the two oscillators provides a characterization of the relative component speeds.

As explained in more detail below, the frequencies of the outputs of the two can be graphed one as a function of the other, and a line can be drawn that signifies a predetermined relationship of the speed or performance of the two types of transistors. The predetermined relationship may be selected at the time of fabrication based on process conditions and expected operating conditions.

For example, in some implementations, if the output of the ring oscillator of cross-coupled transistor cells is slower than the output of the DRO, then the p-type components are faster than the n-type components. If the output of the ring oscillator of cross-coupled transistor cells is faster than the output of the DRO, then the n-type components are faster than the p-type components. If the outputs are graphed with the output of the ring oscillator of cross-coupled transistor cells on the y-axis, and the output of the DRO on the x-axis, if the point defined by the two outputs is above the line signifying predetermined performance, then the n-type components are faster relative to the p-type components than the predetermined relationship. If the point defined by the two outputs is below the line signifying predetermined performance, then the n-type components are slower relative to the p-type components than the predetermined relationship.

Moreover, with sufficient calibration as described below, when the outputs of the two oscillators are on or near the aforementioned line, it may be possible to conclude not only that the speeds of the n-type components and the p-type components bear the predetermined relationship to each other, but also whether the two speeds are target speeds, are faster than target speeds, or are slower than target speeds. Again, in this context, "target" speed or performance refers to a speed or performance selected at the time of fabrication based on process conditions and expected operating conditions (e.g., voltage and temperature). This target may be characterized by a maximum current that can be carried by a component.

Although the implementation described above shows only one oscillator of each type on a semiconductor die, if process variations across the die are a concern, then pairs of oscillators of the two types may be distributed across the die for better characterization of the performance of components in different portions of the die.

The subject matter of this disclosure may be better understood by reference to FIGS. 1-7.

Figure 1:
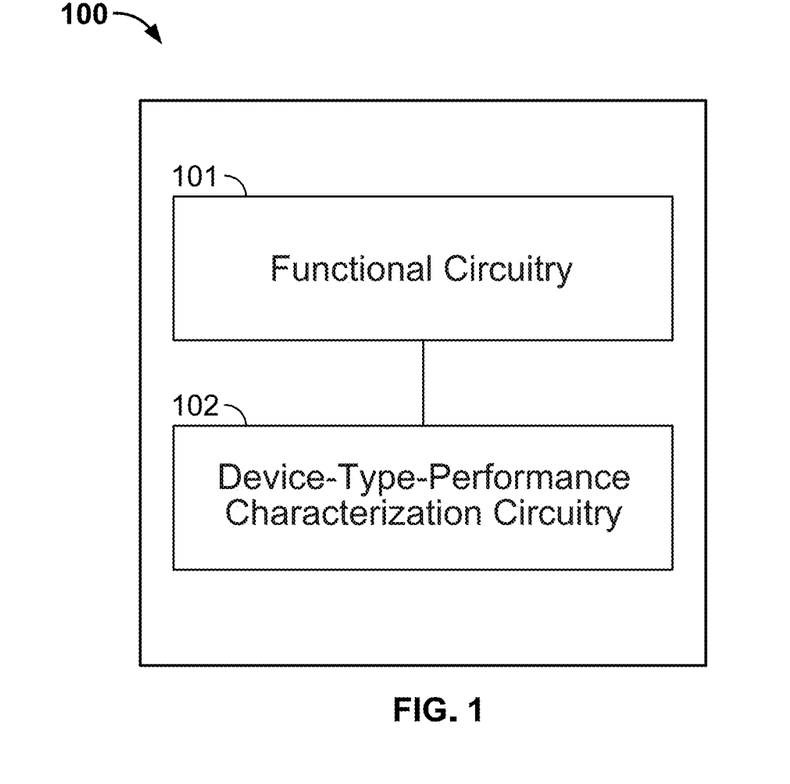
FIG. 1 is a high-level diagram of an electronic device incorporating components that may be characterized using implementations of the subject matter of this disclosure.
Figure 2:
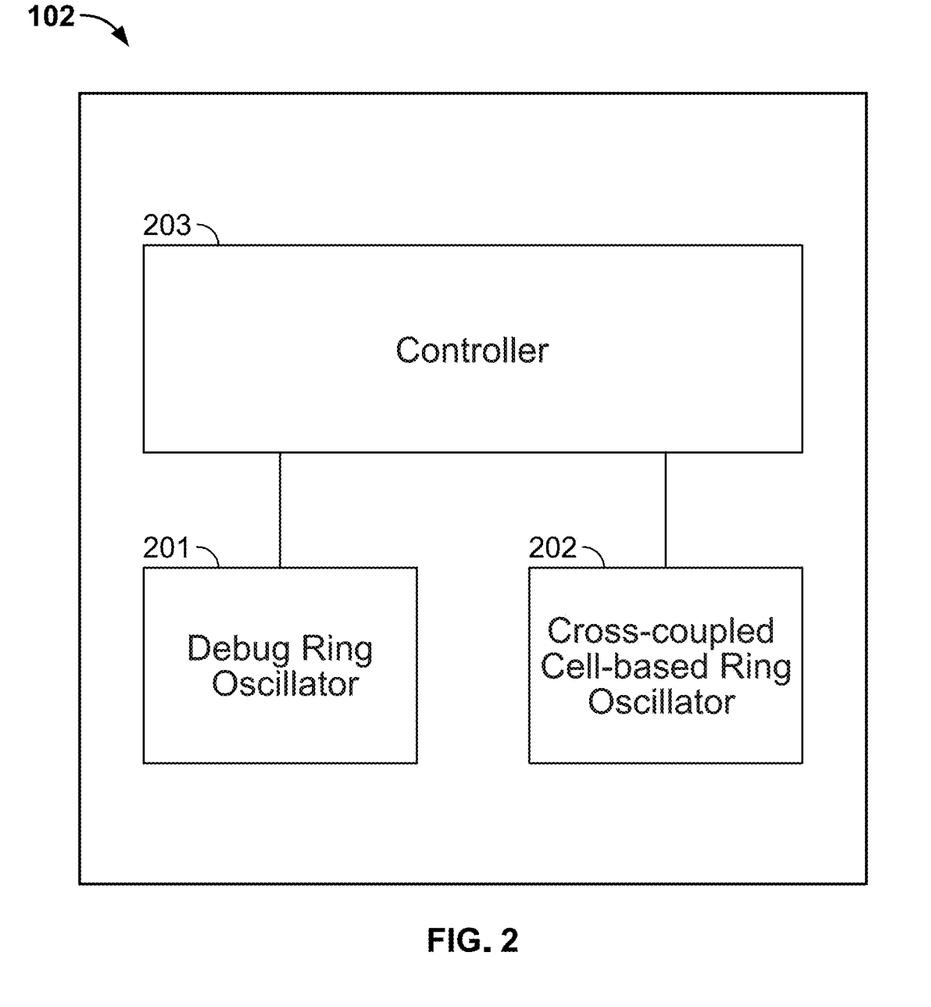
FIG. 2 is a diagram of performance characterization circuitry according to implementations of the subject matter of this disclosure.

FIG. 1 is a high-level diagram of an electronic device 100 such as a network switch, an Internet physical layer transceiver (PHY), or other system-on-chip (SoC), having functional circuitry 101 and circuitry 102 for performance characterization of different device types, which is shown in more detail in FIG. 2. As seen in FIG. 2, in implementations according to subject matter of this disclosure, device-typeperformance characterization circuitry 102 includes at least one pair of the two different types of oscillator—a typical inverter-based ring oscillator 201 and a ring 202 of cross-coupled transistor cells—that are described above. Outputs of the two ring oscillators 201, 202 are compared in controller 203 and the relative values of the outputs of the two ring oscillators 201, 202 yield a characterization of the device, as described below.

Figure 3:
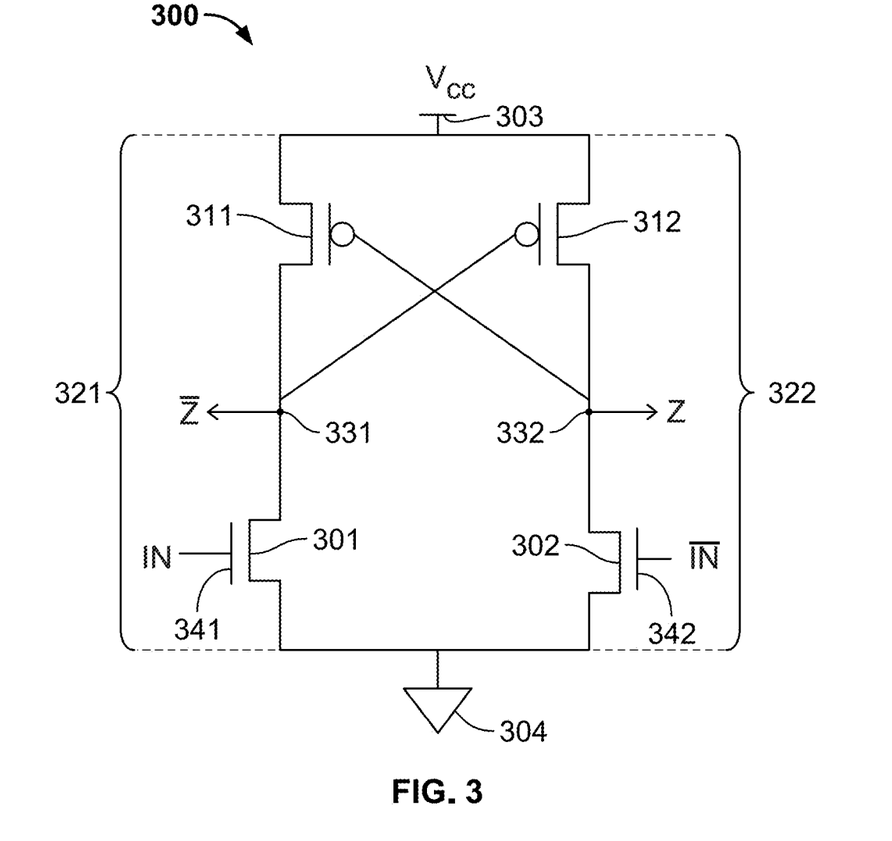
FIG. 3 is a diagram of a transistor cell incorporated in performance characterization circuitry according to implementations of the subject matter of this disclosure.

One implementation 300 of a cross-coupled transistor cell of the type that may be used in ring oscillator 202 is shown in FIG. 3. In this implementation, cross-coupled transistor cell 300 includes a first series coupling 321 of a first n-type (e.g., NMOS) transistor 301 in series with a first p-type (e.g., PMOS) transistor 311, and a second series coupling 322 of a second n-type (e.g., NMOS) transistor 302 in series with a second p-type (e.g., PMOS) transistor 312. First series coupling 321 and second series coupling 322 are coupled in parallel between $V_{cc}$ supply voltage 303 and ground 304, with the p-type transistors 311, 312 located closer to $V_{cc}$ supply voltage 303. Junction 331 between first n-type transistor 301 and first p-type transistor 311 is cross-coupled to the gate of second p-type transistor 312, while junction 332 between second n-type transistor 302 and second p-type transistor 312 is cross-coupled to the gate of first p-type transistor 311.

The gate 341 of first n-type transistor 301 is the uninverted input (IN) of cell 300. The gate 342 of second n-type transistor 302 is the inverted input ($\overline{IN}$) of cell 300. Junction 332 is the uninverted output (Z) of cell 300, and junction 331 is the inverted output ($\overline{Z}$).

As explained above, in operation, as the input on gate 341 rises and the input on gate 342 falls, second n-type transistor 302 conducts less until it stops conducting, and first n-type transistor 301 starts conducting. For the outputs to change states, with the uninverted output on junction 332 rising and the inverted output on junction 331 falling, first p-type transistor 311 should conduct less until it stops conducting and second p-type transistor 312 should start conducting. Because of the cross-coupled structure, and because CMOS devices are not strictly 'ON' or 'OFF' but conduct more or less strongly as the gate voltage changes, the cell outputs 331, 332 will change states only when first n-type transistor 301 starts conducting strongly enough to overcome the current of first p-type transistor 311, which pulls junction 331 down enough to start conduction in second p-type transistor 312, which in turn starts to pull junction 332 higher to further weaken first p-type transistor 311.

The process operates in the opposite manner when the states are changing in the other direction, giving cell 300 a hysteresis-like delay in either direction before it changes state. That delay is a function of the relative strengths of first n-type transistor 301 and first p-type transistor 311, meaning that the delay is an indication of the relative strengths of first n-type transistor 301 and first p-type transistor 311.

Figure 4:
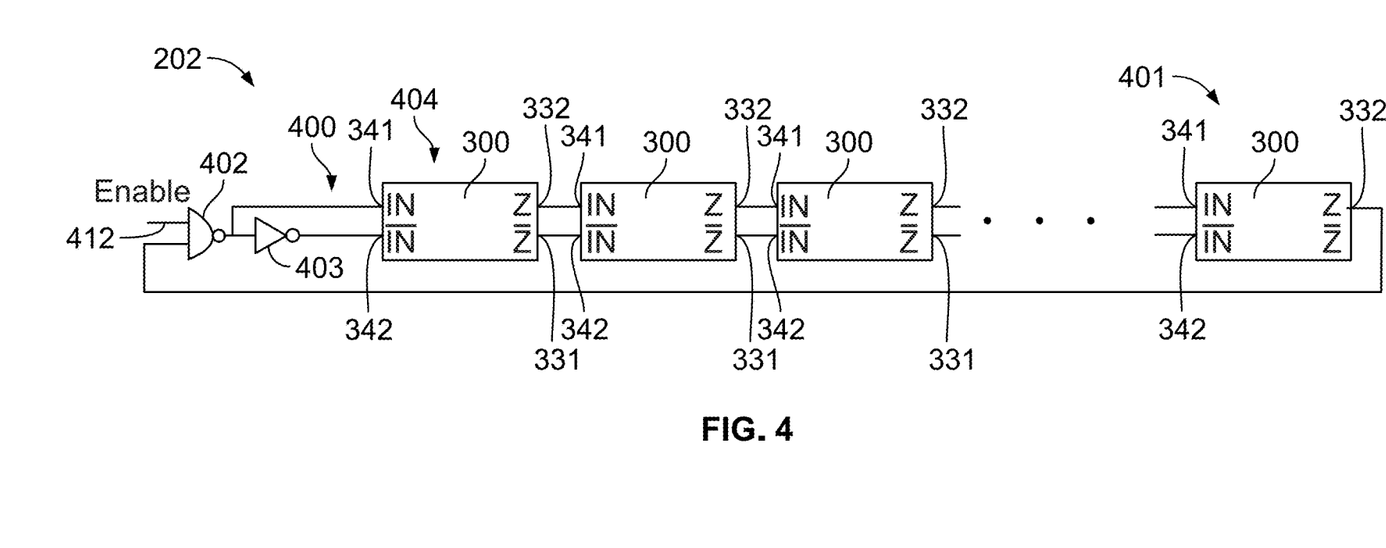
FIG. 4 is a diagram of a ring oscillator incorporating a transistor cell as in FIG. 3, according to implementations of the subject matter of this disclosure.

An even number of cells 300 may be connected to form ring oscillator 202 as shown in FIG. 4. The inverted output on junction 331 of each cell is coupled to the inverted input 342 of the next cell, while the uninverted output on junction 332 of each cell is coupled to the uninverted input 341 of the next cell.

In place of an additional cell 300, as might be expected in a standard ring oscillator based on an odd number of inverters, at a "beginning/end" position 400 of ring oscillator 202, the uninverted output 332 of the "last" cell 401 is fed back to a NAND gate 402 that is used as an ENABLE gate. The output of enable gate 402 coupled to the uninverted input 341 of the "first" cell 404 and, via an inverter 403, to the inverted input 342 of first cell 404. A second input 412 of NAND gate 402 is used as an ENABLE signal to turn on ring oscillator 202 when testing is required or desired.

The output of ring oscillator 202 is a signal having a frequency. The frequency is highest when the n-type transistors are faster than the p-type transistors. The frequency is lowest when the p-type transistors are faster than the n-type transistors. The frequency has an intermediate value when the speed of the n-type transistors and the speed of the p-type transistors are comparable, or about the same. However, the high, low and intermediate frequency values are not necessarily predictable, because they vary from die to die according to the process conditions during die fabrication. Moreover, the output frequency on a single die may vary with other conditions, such as temperature. Therefore, while the output of ring oscillator 202 varies with the relative speeds of the n-type and p-type transistors, the output of ring oscillator 202 by itself is not sufficient to indicate the relative speeds of the n-type and p-type transistors.

However, as noted above, the structure of standard DRO 201 cancels out the differential effects between the n-type transistors and the p-type transistors. Thus, the output of DRO 201, which also is a signal having a frequency, always has a value that appears to indicate that speed of the n-type transistors is comparable to the speed of the p-type transistors. Therefore, comparison of the output of oscillator 202, which varies based on relative component speeds, to the output of oscillator 201, which does not vary based on relative component speeds, provides a characterization of the relative component speeds.

Specifically, as noted above, the frequencies of the outputs of the two oscillators 201, 202 can be graphed one as a function of the other, and a line can be drawn that signifies a predetermined relationship of the speed or performance of the two types of transistors. The predetermined relationship may be selected at the time of fabrication based on process conditions and expected operating conditions.

If the output of ring oscillator 202 of cross-coupled transistor cells 300 is slower than the output of DRO 201, then the p-type components are faster than the n-type components. If the output of ring oscillator 202 of cross-coupled transistor cells 300 is faster than the output of DRO 201, then the n-type components are faster than the p-type components. If the outputs are graphed with the output of the ring oscillator of cross-coupled transistor cells on the y-axis, and the output of the DRO on the x-axis, if the point defined by the two outputs is above the line signifying predetermined performance, then the n-type components are faster relative to the p-type components than the predetermined relationship. If the point defined by the two outputs is below the line signifying predetermined performance, then the n-type components are slower relative to the p-type components than the predetermined relationship.

Figure 5:
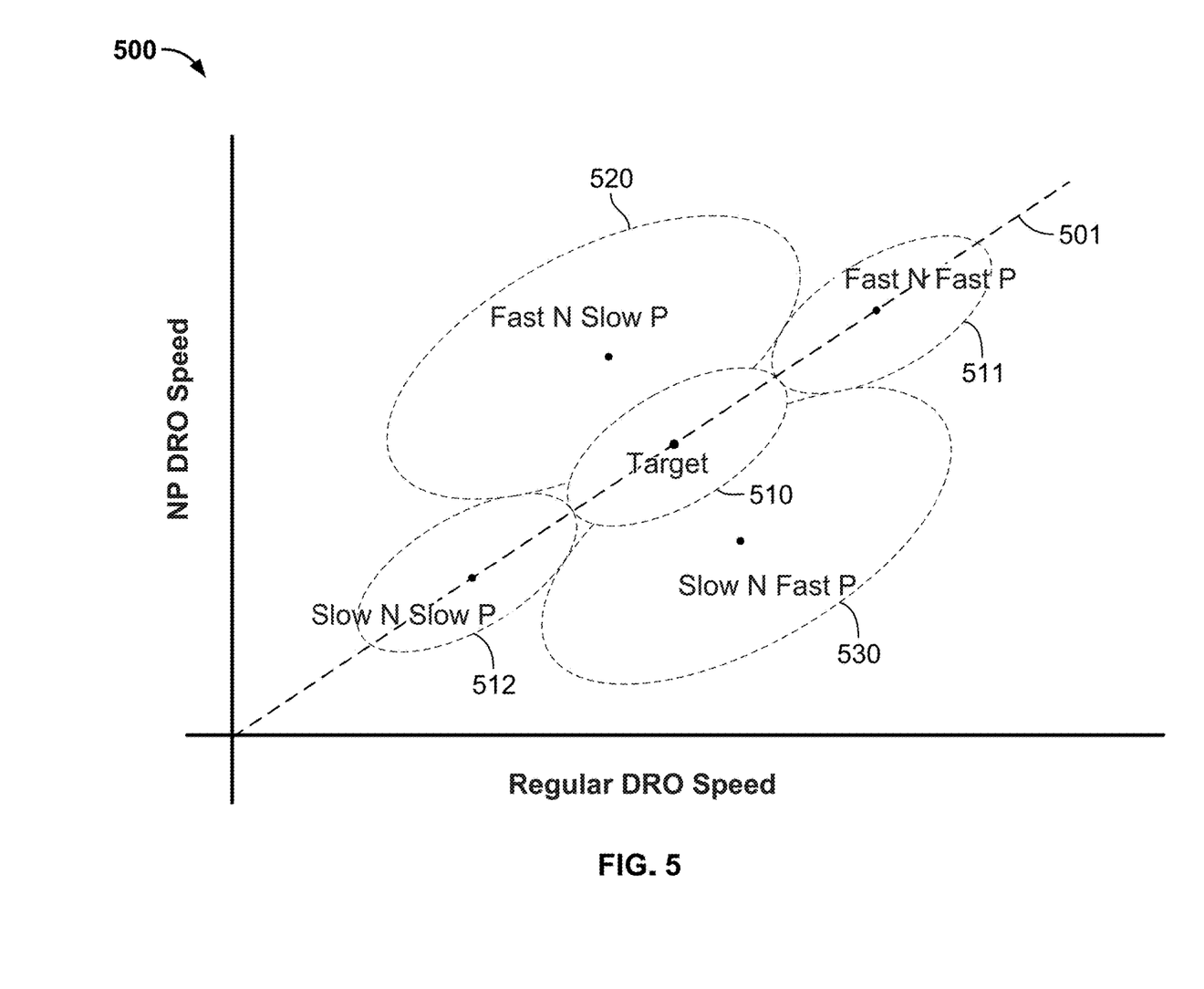
FIG. 5 is a scatter plot of output of components characterization circuitry according to implementations of the subject matter of this disclosure.

FIG. 5 is a scatter plot 500 in which each point indicates the frequency outputs of oscillator 201 on the abscissa, and the frequency outputs of oscillator 202 on the ordinate. The values on scatter plot 500 may be obtained by actual measurement of a large number of devices, or by simulation.

If both oscillators were the same, all points on scatter plot 500 would fall on a diagonal line (y=x). Similarly, with the different oscillators 201 and 202, a line 501 can be defined such that when the speeds of the n-type components and the p-type components bear a target relationship to each other, all points on scatter plot 500 would fall on or near line 501. Depending on the target relationship between the n-type components and the p-type components, line 501 could be a pure diagonal—i.e., y=x—or may indicate some other relationship, y=mx+b, where m is the slope and b is the y-intercept. A target tolerance also may be defined, such that a point defined by the outputs of the two oscillators need not fall precisely on line 501 for the relationship between the n-type components and the p-type components to be considered to meet the target relationship.

Moreover, where the relative performance of the n-type components and the p-type components were within the target relationship defined above, the speeds of both types of components may nevertheless vary from a predetermined "target" speed. That is, while the relative performance may be within the target relationship, both types of components may be faster or slower than a target speed. Thus, in an example, even for outputs on line 501 or sufficiently close to be considered near line 501, components having the target speed would fall in region 510. If the speeds of the n-type components and the p-type components, even though bearing the target relationship to each other, were faster than the target speeds, the points may fall in region 511. If the speeds of the n-type components and the p-type components, even though bearing the target relationship to each other, were slower than the target speeds, the points may fall in region 512.

If the n-type components were faster relative to the p-type components than would be expected according to the target relationship, the points on scatter plot 500 would all be substantially above line 501 (i.e., above region 510), falling in region 520. Similarly, if the n-type components were slower relative to the p-type components than would be expected according to the target relationship, the points on scatter plot 500 would all be substantially below line 501 (i.e., below region 510), falling in region 530.

The specific shapes and locations of regions 510, 511, 512, 520 and 530 are illustrative only. The actual shapes and locations will differ according to the desired targets, and also from batch to batch of semiconductor dice as determined by a calibration process including measurement or simulation of a large number of semiconductor devices.

Scatter plot 500 may be obtained by simulation, as noted above, or by testing a large number of actual dice from a representative number of samples—e.g., several hundred—from different batches. Scatter plot 500 may then be stored in device-type-performance characterization circuitry 102 for use by controller 132 in determining the relative performance of n-type components and p-type components based on the outputs of DRO 201 and ring oscillator 202.

Figure 6:
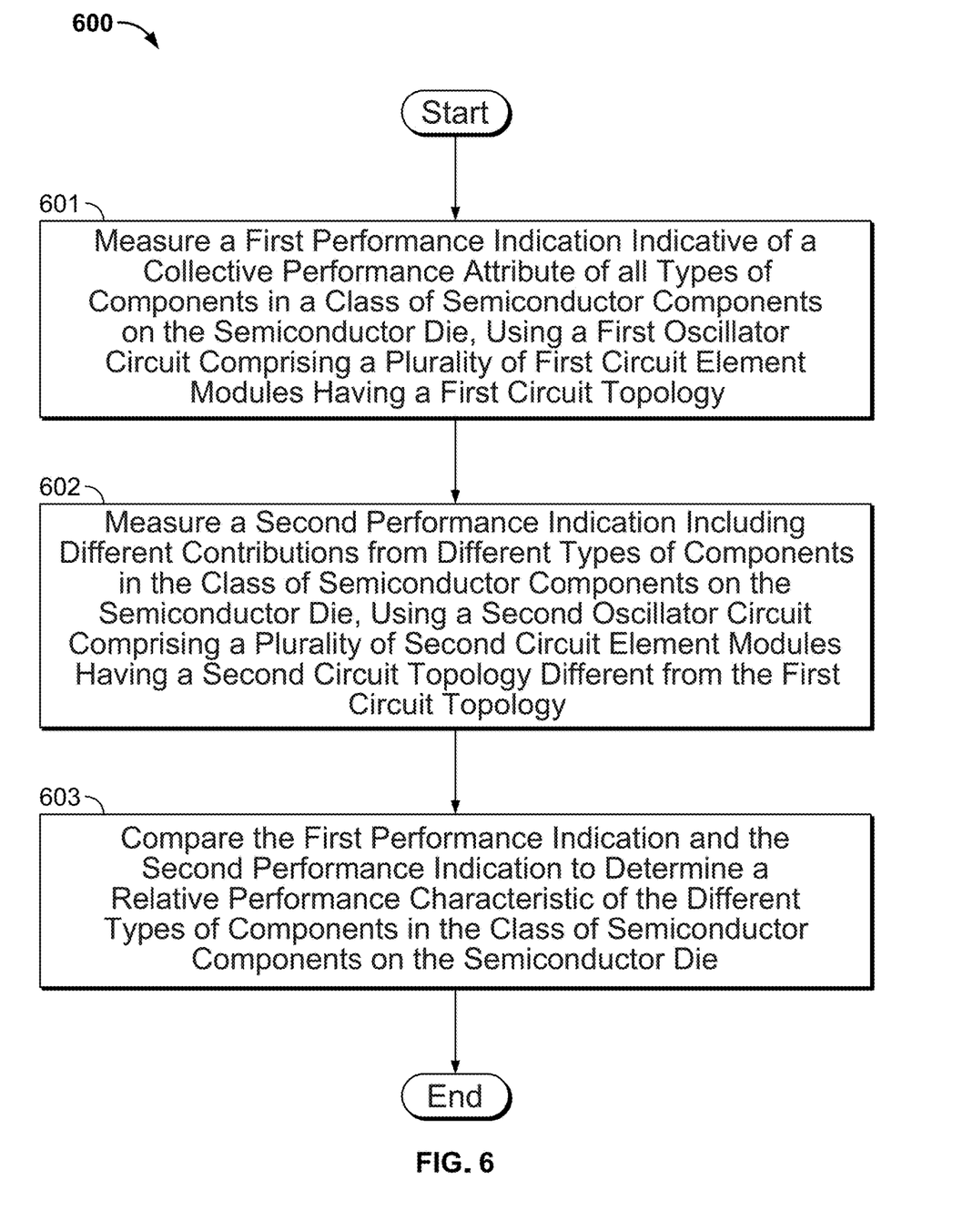
FIG. 6 is a flow diagram of a method according to implementations of the subject matter of this disclosure for characterizing semiconductor components.

A method 600, according to implementations of the subject matter of this disclosure, for characterizing the relative performance of different types of a class of semiconductor components, is diagrammed in FIG. 6.

Method 600 begins at 601 where a first performance indication indicative of a collective performance attribute of all types of components in a class of semiconductor components on the semiconductor die is measured using a first oscillator circuit comprising a plurality of first circuit element modules (e.g., inverters) having a first circuit topology. At 602, a second performance indication including different contributions from different types of components in the class of semiconductor components on the semiconductor die is measured using a second oscillator circuit comprising a plurality of second circuit element modules (e.g., cross-coupled transistor cells as described above) having a second circuit topology different from the first circuit topology. At 603, the first performance indication and the second performance indication are compared to determine a relative performance characteristic of the different types of components in the class of semiconductor components on the semiconductor die, and method 600 ends.

Figure 7:
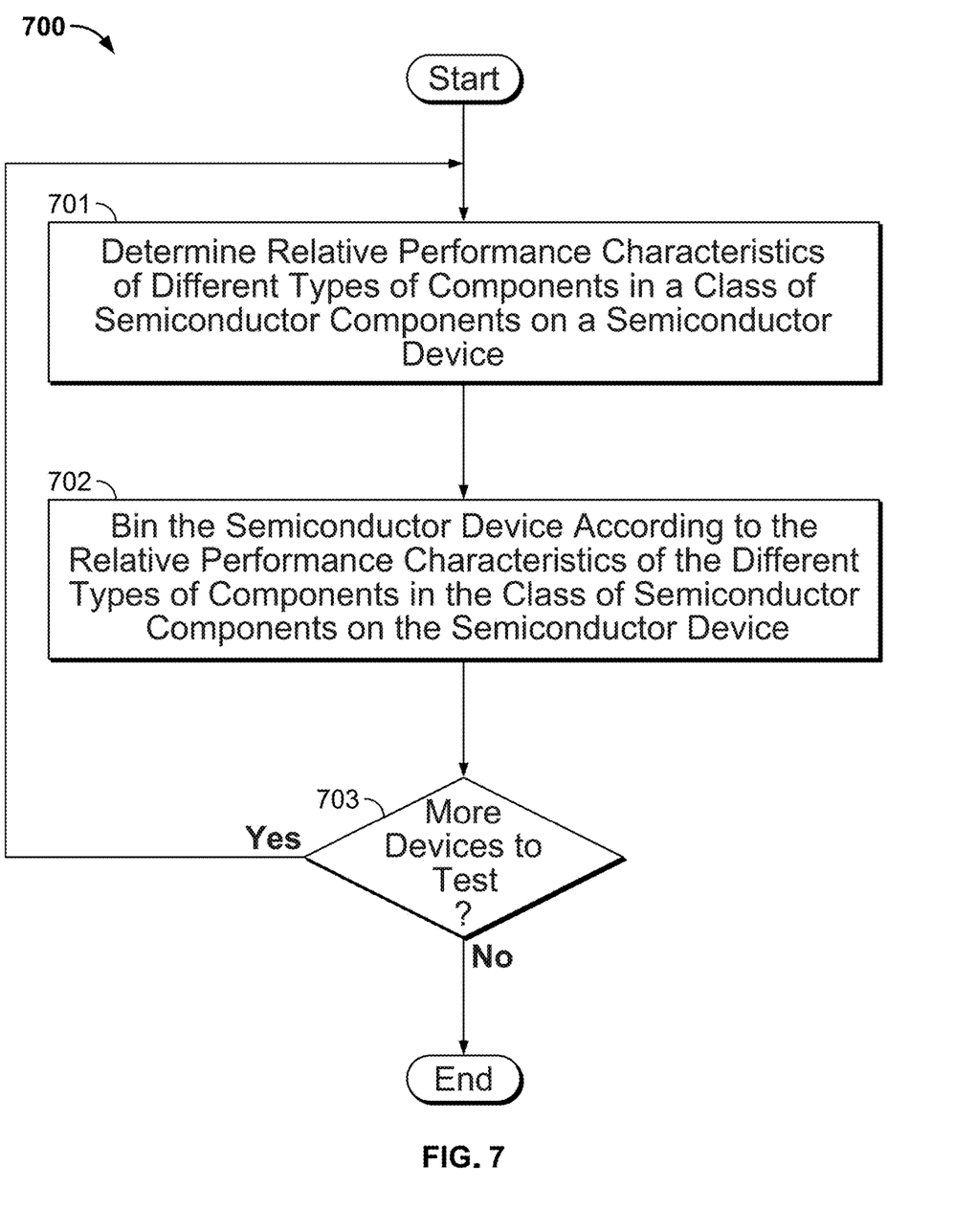
FIG. 7 is a flow diagram of a method according to implementations of the subject matter of this disclosure for classifying semiconductor components.

A method 700 according to a further implementation of the subject matter of this disclosure is diagrammed in FIG. 7. Method 700 may be used by a manufacturer or fabricator of semiconductor devices, or by a consumer of large numbers of semiconductor devices, to classify semiconductor devices according to the relative performance different types of a class of semiconductor components on the semiconductor devices. Such a method may be used by a manufacturer or fabricator of the devices to classify and bin the devices so that customer requests for devices with particular performance characteristics may be more easily fulfilled. Such a method may be used by a consumer of such devices to classify and bin the devices so that they may be used to assemble electronic systems having particular performance characteristics based on the performance characteristics of the semiconductor devices, or to enable electronic systems that are being assembled to be given uniform performance characteristics by taking into account, and adjusting for, the different performance characteristics of the semiconductor devices.

Method 700 begins at 701 where relative performance characteristics of different types of components in a class of semiconductor components on a semiconductor device are determined (e.g., in accordance with method 600). At 702, the semiconductor device is binned according to the relative performance characteristics of the different types of components in the class of semiconductor components on the semiconductor device. At 703, it is determined whether there are more devices to classify. If not, method 700 ends. If at 703 there are more devices to classify, flow returns to 701 where relative performance characteristics of different types of components in a class of semiconductor components on another semiconductor device are determined and method 700 continues.

Thus it is seen that a method and circuitry for determining the relative speeds of different types of a class of semiconductor components on the same integrated circuit die of a semiconductor device have been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. Electronic apparatus comprising:
   operational circuitry disposed on a semiconductor die; and
   performance measuring circuitry on the semiconductor die for determining relative operational performance attributes of different types of a class of semiconductor component disposed on the semiconductor die, the performance measuring circuitry comprising:
   a first oscillator circuit comprising a plurality of first circuit element modules having a first circuit topology, the first oscillator circuit being configured to provide a first performance indication indicative of a collective performance attribute of all types of components in the class of semiconductor components on the semiconductor die;
   a second oscillator circuit separate from the first oscillator circuit, the second oscillator circuit comprising a plurality of second circuit element modules having a second circuit topology different from the first circuit topology of the first circuit element modules, the second oscillator circuit being configured to provide a second performance indication responsive to different contributions from different types of components in the class of semiconductor components on the semiconductor die; and a comparison circuit configured to receive an output of the first oscillator circuit and an output of the second oscillator circuit, and to determine a relative performance characteristic of the different types of components in the class of semiconductor components on the semiconductor die.

2. The circuitry of claim 1, wherein the class of semiconductor component is transistors.

3. The circuitry of claim 2, wherein a first type of semiconductor component in the class of semiconductor components is an n-type transistor and a second type of semiconductor component in the class of semiconductor components is a p-type transistor.

4. The circuitry of claim 1, wherein:
the first oscillator circuit is a first ring oscillator, and each circuit element module in the plurality of first circuit element modules having the first circuit topology is an inverter; and
the second oscillator circuit is a second ring oscillator, and each circuit element module in the plurality of second circuit element modules having the second circuit topology is a cross-coupled differential cell including a plurality of components from each of the types of semiconductor components in the class of semiconductor components.

5. The circuitry of claim 4 wherein:
the first ring oscillator has a frequency response that is insensitive to differences in performance between a first type of semiconductor component and a second type of semiconductor component; and
the second ring oscillator has a frequency response that differs depending on relative performance of the first type of semiconductor component and the second type of semiconductor component on the semiconductor die.

6. The circuitry of claim 5 wherein:
output of the first ring oscillator has a first frequency;
output of the second ring oscillator has a second frequency; and
the comparison circuitry is configured to indicate, based on relative values of the first frequency and the second frequency, that (a) the first type of semiconductor component and the second type of semiconductor component have speeds with a target relationship, (b) the relationship of the speed of the first type of semiconductor component to the speed of the second type of semiconductor component exceeds the target relationship, or (c) the relationship of the speed of the second type of semiconductor component to the speed of the first type of semiconductor component exceeds the target relationship.

7. The circuitry of claim 6, wherein:
the comparison circuitry is further configured to, when the speed of the first type of semiconductor component and the speed of the second type of semiconductor component meet the target relationship, indicate that the speed of the first type of semiconductor component and the speed of the second type of semiconductor component are (a) target speed values, (b) faster than target speed values, or (c) slower than target speed values.

8. The circuitry of claim 4, wherein the cross-coupled differential cell comprises:
a first n-type transistor in series with a first p-type transistor, there being a first junction between the first n-type transistor and the first p-type transistor; and
a second n-type transistor in series with a second p-type transistor, there being a second junction between the second n-type transistor and the second p-type transistor; wherein:
the first n-type transistor in series with the first p-type transistor is coupled in parallel with the second n-type transistor in series with the second p-type transistor;
a gate of the first p-type transistor is cross-coupled to the second junction; and
a gate of the second p-type transistor is cross-coupled to the first junction.

9. The circuitry of claim 8, wherein, in the ring of cross-coupled differential cells:
an uninverted output of each cell is coupled to an uninverted input of a subsequent cell; and
an inverted output of each cell is coupled to an inverted input of the subsequent cell.

10. A method of determining relative operational performance attributes of different types of a class of semiconductor component that are included in an integrated circuit disposed on a semiconductor die, the method comprising:
measuring a first performance indication indicative of a collective performance attribute of all types of components in the class of semiconductor components on the semiconductor die, using a first oscillator circuit comprising a plurality of first circuit element modules having a first circuit topology;
measuring a second performance indication responsive to different contributions from different types of components in the class of semiconductor components on the semiconductor die, using a second oscillator circuit separate from the first oscillator circuit, the second oscillator circuit comprising a plurality of second circuit element modules having a second circuit topology different from the first circuit topology of the first circuit element modules; and
comparing the first performance indication and the second performance indication to determine a relative performance characteristic of the different types of components in the class of semiconductor components on the semiconductor die.

11. The method of claim 10, wherein:
measuring a first performance indication indicative of a collective performance attribute of all types of components in the class of semiconductor components comprises measuring performance of a first type of transistor and performance of a second type of transistor.

12. The method of claim 11, wherein:
measuring performance of a first type of transistor and performance of a second type of transistor comprises measuring performance of an n-type transistor and performance of a p-type transistor.

13. The method of claim 10, wherein:
the measuring a first performance indication indicative of a collective performance attribute of all types of components in the class of semiconductor components comprises measuring a first performance indication indicative of a collective performance attribute of all types of components in the class of semiconductor components using a first ring oscillator in which each circuit element module in the plurality of first circuit element modules having the first circuit topology is an inverter; and the measuring a second performance indication including different contributions from different types of components in the class of semiconductor components on the semiconductor die comprises measuring a second performance indication including different contributions from different types of components in the class of semiconductor components on the semiconductor die using a second ring oscillator in which each circuit element module in the plurality of second circuit element modules having the second circuit topology is a cross-coupled differential cell including a plurality of components from each of the types of semiconductor components in the class of semiconductor components.

14. The method of claim 13, wherein:

the measuring a first performance indication indicative of a collective performance attribute of all types of components in the class of semiconductor components using the first ring oscillator comprises measuring a first performance indication indicative of a collective performance attribute of all types of components in the class of semiconductor components using the first ring oscillator that has a frequency response that is insensitive to differences in performance between different types of components in the class of semiconductor components; and the measuring a second performance indication responsive to different contributions from different types of components in the class of semiconductor components on the semiconductor die using a second ring oscillator comprises measuring a second performance indication responsive to different contributions from different types of components in the class of semiconductor components on the semiconductor die using a second ring oscillator using the ring oscillator that has a frequency response that differs depending on relative performance of the different types of components in the class of semiconductor components.

15. The method of claim 14, wherein:

when output of the first ring oscillator has a first frequency, and output of the second ring oscillator has a second frequency, the comparing the first performance indication and the second performance indication comprises indicating, based on relative values of the first frequency and the second frequency, that (a) the first type of component in the class of semiconductor components and the second type of component in the class of semiconductor components have speeds with a target relationship, (b) the relationship of the speed of the first type of component in the class of semiconductor components to the speed of the second type of component in the class of semiconductor components exceeds the target relationship, or (c) the relationship of the speed of the second type of component in the class of semiconductor components to the speed of the first type of component in the class of semiconductor components exceeds the target relationship.

16. The method of claim 15, wherein:

the comparing the first performance indication and the second performance indication further comprises, when the speed of the first type of component in the class of semiconductor components and the speed of second type of component in the class of semiconductor components meet the target relationship, indicating that the speed of the first type of component in the class of semiconductor components and the speed of the second type of component in the class of semiconductor components are (a) target speed values, (b) faster than target speed values, or (c) slower than target speed values.

17. The method of claim 16, further comprising calibrating the comparing.

18. The method of claim 17, wherein the calibrating comprises:

measuring performance of a first one of the first type of component in the class of semiconductor components having a known first performance and measuring performance of a second one of the second type of component in the class of semiconductor components having a known second performance where the known first performance and the known second performance meet a first predetermined relationship, and storing a first result indicative of a first performance metric of a combination of the first type of component in the class of semiconductor components and the second type of component in the class of semiconductor components;

measuring performance of a second one of the first type of component in the class of semiconductor components having a known third performance and measuring performance of a second one of the second type of component in the class of semiconductor components having a known fourth performance that is known to exceed a second predetermined relationship to the known third performance, and storing a second result indicative of a second performance metric of the combination of the first type of component in the class of semiconductor components and the second type of component in the class of semiconductor components; and measuring performance of a third one of the first type of component in the class of semiconductor components having a known fifth performance and measuring performance of a third one of the second type of component in the class of semiconductor components having a known sixth performance where the known fifth performance is known to exceed a third predetermined relationship to the known sixth performance, and storing a third result indicative of a third performance metric of the combination of the first type of component in the class of semiconductor components and the second type of component in the class of semiconductor components.

19. The method of claim 18, wherein the storing a first result indicative of a first performance metric of a combination of the first type of component in the class of semiconductor components and the second type of component in the class of semiconductor components comprises storing a performance metric indicating that the speed of the first type of component in the class of semiconductor components and the speed of the second type of component in the class of semiconductor components are (a) target speed values, (b) faster than target speed values, or (c) slower than target speed values.

20. The method of claim 18 wherein the indicating, based on relative values of the first frequency and the second frequency, comprises comparing the relative values of the first frequency and the second frequency to the first performance metric, the second performance metric and the third performance metric.

* * * * *